United States Patent [19]

Dorman et al.

[11] Patent Number: 4,484,038

[45] Date of Patent: Nov. 20, 1984

[54] MEMBRANE TOUCH PANEL HAVING IMPROVED CONDUCTOR CONSTRUCTION

[75] Inventors: William E. Dorman, Boxford; Gary Brown, Newbury, both of Mass.

[73] Assignee: Dorman-Bogdonoff Corp., Andover, Mass.

[21] Appl. No.: 445,694

[22] Filed: Dec. 1, 1982

[51] Int. Cl.³ ............................................ H01H 13/70
[52] U.S. Cl. .................................................. 200/5 A
[58] Field of Search .................. 200/5 A, 159 B, 292, 200/86 R, 267, 268

[56] References Cited

U.S. PATENT DOCUMENTS

| | | | |
|---|---|---|---|
| 4,046,975 | 9/1977 | Seeger, Jr. ......................... | 200/5 A |
| 4,085,302 | 4/1978 | Zenk et al. ........................ | 200/5 A |
| 4,143,253 | 3/1979 | Wagner et al. .................... | 200/5 A |
| 4,360,716 | 11/1982 | Fiorella ............................ | 200/5 A |

Primary Examiner—J. R. Scott
Attorney, Agent, or Firm—Wolf, Greenfield & Sacks

[57] ABSTRACT

A flexible membrane touch panel switch having contacts comprised of a first set of thin conductive metal film strips formed on a first layer, and of a second set of thin conductive metal film strips orthogonal to the first set and formed on a second layer, the second layer being spaced apart from and selectively movable into contact with the first layer, the panel further having silver conductive leads formed on each of the layers, each lead being integrally affixed at one end to, in electrical contact with, and extending from one of the strips for connection to external circuitry.

10 Claims, 4 Drawing Figures

MEMBRANE TOUCH PANEL HAVING IMPROVED CONDUCTOR CONSTRUCTION

BACKGROUND OF THE INVENTION

This invention relates to a flexible membrane switch, and more particularly to a transparent membrane panel wherein conductors, in the area of the switch contacts, are comprised of transparent, electrically-conductive thin film layers of gold or other metal.

Transparent flexible membrane touch panels for application to the screen of a cathode ray tube are known in the prior art. Such switch panels typically include a lower layer carrying a first set of conductive strips oriented in one direction, and a flexible upper layer carrying a second set of conductive strips orthogonal to and spaced from the first set. Pressure applied to the upper layer can cause electrical contact between any one of the first set of strips and any one of the second set of strips, thereby enabling the sensing of the coordinates of the applied pressure. Typically, the conductive strips are formed of transparent conductive gold. Because of the high cost of gold, and the complications involved in forming gold conductive leads for satisfactory connection to external circuitry, electrical connection between the switch panel and external devices is made through hard wire leads soldered to the gold conductive strips.

BRIEF DESCRIPTION OF THE INVENTION

In the preferred embodiment of the transparent switch of the instant invention, the conductors are formed of vacuum-metallized gold in the area of the switch contacts. These thin gold conductive strips are integrally connected to silver conductive leads brought away from the contact area for connection to external circuitry. Typically, these silver conductive leads terminate on a conventional flexible tail or tails. By using such silver conductive leads, the conductors may be brought away from the switch in flat form, thereby enabling use of a flexible tail, if desired, and eliminating the need for soldering hard wire leads to the panel. By utilizing gold conductors in the contact area, the transparency of the switch may be maintained.

Accordingly, it is an object of this invention to provide a membrane switch having conductors that are transparent in the contact area.

It is a further object of this invention to provide such a membrane switch having conductors that exit in flat form, without the need for hard wire leads soldered to the switch, for connection to external circuitry.

It is a further object of this invention to provide such a membrane switch having conductors that exit on an integral flexible tail.

DETAILED DESCRIPTION OF THE INVENTION

A typical transparent membrane touch panel is comprised of an upper contact-carrying layer, a spacer layer, and a lower contact-carrying layer. The contact areas comprise a first set of thin, transparent conductive strips (preferably gold) running in one direction on the under surface of the top layer, and a second set of thin, transparent conductive strips running perpendicular to the first set and located on the upper surface of the lower layer. By touching the panel at a given location, one of the first set of strips is made to contact one of the second set of strips, thereby completing an electrical circuit and signaling the location (coordinates) of the area touched.

Figure 1:
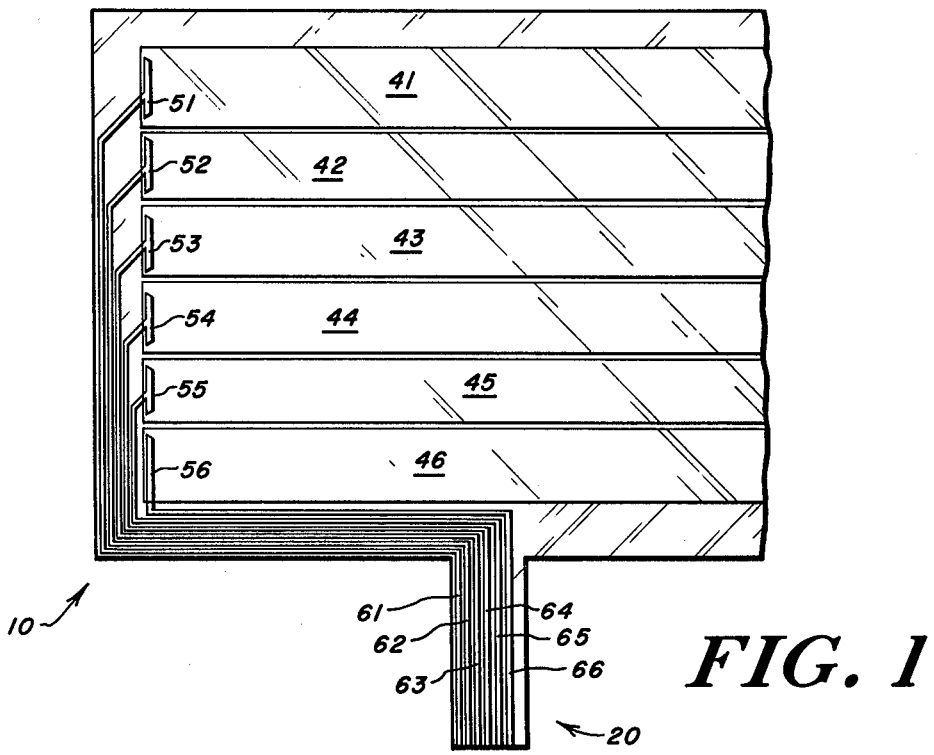
FIG. 1 is a top view of a portion of the top layer of a membrane switch according to the preferred embodiment of the instant invention.

In FIG. 1 there is illustrated a portion of the top layer 10 of such a touch panel, said layer carrying a series of parallel gold conductive strips 41 through 46 formed on the underside of said layer. Said conductive strips 41 through 46 are separated from adjacent strips by a narrow space. Silver conductive leads 61 through 66 are affixed to layer 10 by a conventional screen printing process, such that each lead includes a head portion 51 through 56 respectively, formed in a direction perpendicular to the longer dimension of the particular gold strip. Each silver conductive lead 61 through 66 is seen to terminate on flexible tail 20, which tail is integrally formed with and extending from upper layer 10.

Figure 2:
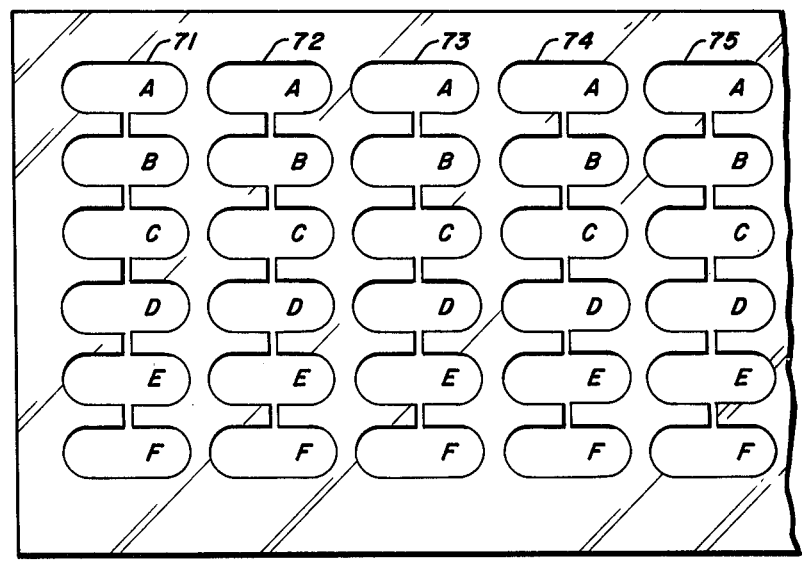
FIG. 2 is a view of a corresponding portion of the spacer layer of a membrane switch according to the preferred embodiment.

Spacer layer 12 is shown in FIG. 2 to include a series of cut-out areas 71, 72, 73, etc. for enabling the conductive strips 41 through 46 to selectively contact the conductive strips 81, 82, 83, etc. (FIG. 3) of the lower layer 14, as further explained below. Each of the cut-out areas 71, 72, 73, etc. in the particular embodiment here shown, includes a series of rounded apertures labeled A through F, connected to adjacent apertures in the cut-out areas by a narrow channel to allow equalization of air pressure when a contact is made. The cut-out areas of spacer 12 could, of course, be made in various shapes, as desired, the illustration of FIG. 2 being only one possibility.

Figure 3:
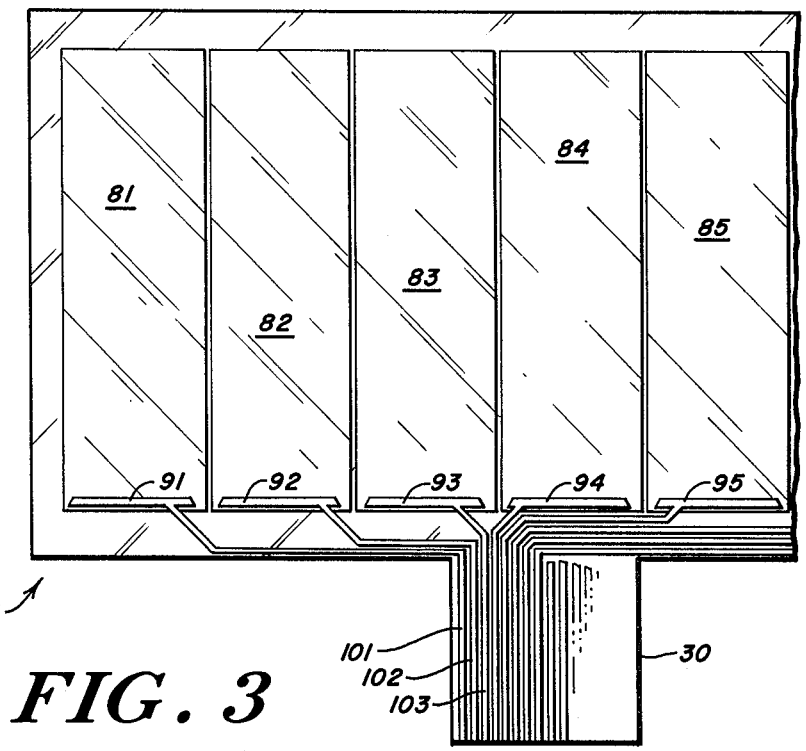
FIG. 3 is a view of a corresponding portion of the lower layer of a membrane switch panel according to the preferred embodiment.

Turning to FIG. 3, lower layer 14 is shown to include a set of parallel gold conductive strips 81, 82, 83, etc. arranged on the upper surface of said layer 14 in a direction perpendicular to strips 41 through 46 of upper layer 10. Silver conductive leads 101, 102, 103, etc. are affixed to lower layer 14 by a conventional screen-printing process such that each lead includes a head portion 91, 92, 93, etc. formed in a direction perpendicular to the longer dimension of the respective strip. Each silver conductive lead 101, 102, 103, etc. is seen to terminate on tail 30 integrally formed with and extending from layer 14.

The preferred embodiment here illustrated depicts a total of six gold conductive strips on upper layer 10, and the first five strips on lower layer 14, but it will be readily appreciated that the instant invention is not confined to any particular number of strips or contact locations.

Figure 4:
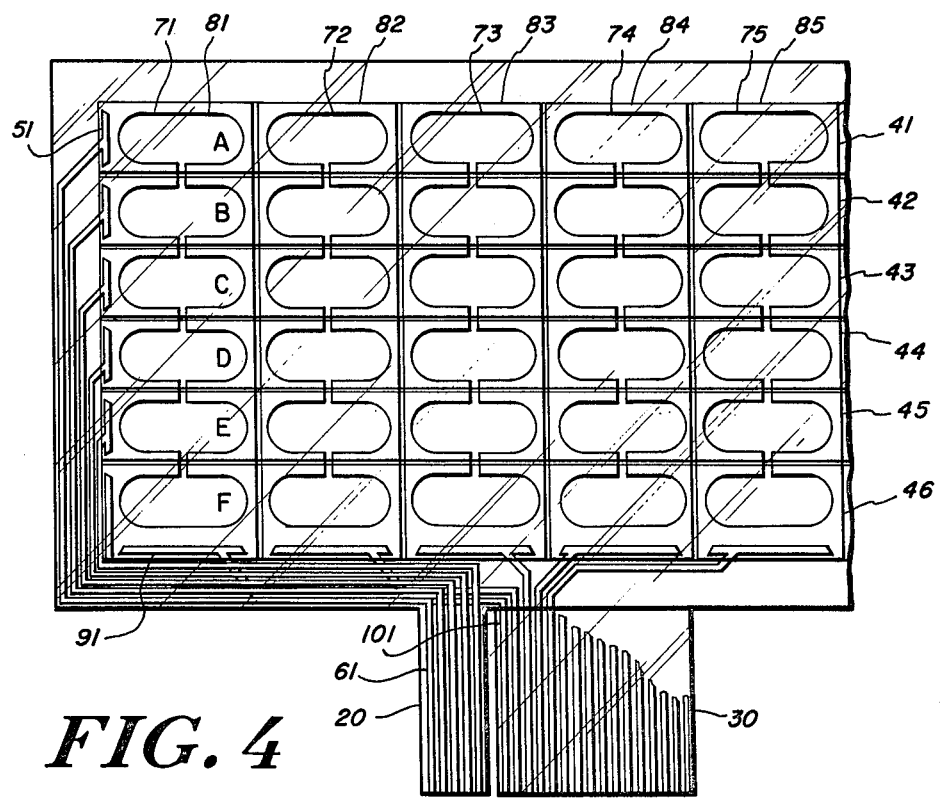
FIG. 4 is a view of a portion of the assembled touch panel in accordance with the preferred embodiment of the instant invention.

When layers 10, 12 and 14 are assembled (FIG. 4), cut-out area 71 lies over conductive strip 81 of lower layer 14, cut-out area 72 lies over strip 82, and so on. Similarly, cut-out areas 71A, 72A, 73A, etc. lie under conductive strip 41 of upper layer 10, cut-out areas 71B, 72B, 73B, etc. lie under conductive strip 42, and so on. Thus, for example, if upper layer 10 is touched above aperture 71A, conductive strip 41 on upper layer 10 will be moved through said aperture into contact with strip 81 on lower layer 14, thereby completing an electrical circuit from conductive lead 61 through head portion 51, to strip 41, to strip 81, through head portion 91, to conductive lead 101. It will be seen that, at whatever area the panel is touched, a circuit will be made that will connect appropriate leads on the upper and lower layers to signify the coordinates at which the touch was made. Because the conductive gold strips in the contact area are transparent, the operator of the switch panel may view information or indicia displayed under the switch, for example on a cathode ray tube to which the switch panel has been affixed, and may thus operate the switch in interactive response to the viewed information or indicia.

In the switch here disclosed, the discrete gold conductive strips 41 through 46 and 81, 82, 83, etc. are formed on layers 10 and 14 respectively, by a scoring process, the gold having been deposited on said layers in the particular embodiment here described by a process utilizing a conductive gold produced by Evaporated Metallization of Utica, N.Y. Prior to the placing of the gold strips on the layers, a nickel binder is first deposited on the polycarbonate so that the gold will adhere to the polycarbonate without the need for a protective coating over the gold after it is deposited on the polycarbonate. The silver leads can then be printed directly onto the gold using a silver conductive polymer ink such as duPont 5007 or Product No. 210-6 of Amicon Corp., 25 Hartwell Street, Lexington, Mass.

The silver conductive leads are preferably coated with a dielectric insulating material, such as Product No. 990-14-4 sold by Amicon Corporation by a screen printing process, for purposes of protection and increased reliability of the switch panel.

Layers 10, 12 and 14 may be formed from a polycarbonate such as LEXAN, a product of General Electric, each layer being approximately 10 mils thick. The layers are typically bonded together by an adhesive such as 3M Product No. 468-MP.

It may be seen from the foregoing that the embodiments described herein are by way of illustration and not by way of limitation, and that various changes in and other modifications to the construction, composition, and arrangement of parts are possible in light of the above teachings. Accordingly, it is to be understood that other embodiments of this invention could be utilized without departing from the spirit and scope of the present invention, as set forth in the appended claims.

We claim:

1. In a transparent flexible membrane touch panel having contacts comprised of a first set of thin conductive metal film strips formed on a first layer, and of a second set of thin conductive metal film strips orthogonal to said first set and formed on a second layer, said second layer being spaced apart from and selectively movable into contact with said first layer, the improvement comprising silver conductive leads formed on each of said layers, each lead being integrally affixed at one end to, in electrical contact with, and extending from a respective one of said strips for connection to external circuitry.

2. The panel of claim 1, wherein said silver conductive leads on said first layer terminate on an integral flexible tail extending from said first layer and said silver conductive leads on said second layer terminate on an integral flexible tail extending from said second layer.

3. The panel of claim 1, wherein said metal comprises gold.

4. The panel of claim 2, wherein said metal comprises gold.

5. The panel of claim 3, wherein the portions of said silver conductive leads in contact with said strips are printed directly onto said gold strips.

6. The panel of claim 4, wherein the portions of said silver conductive leads in contact with said strips are printed directly onto said gold strips.

7. The panel of claim 1, wherein the strips of each said set of film strips are rectangular, are substantially longer along one dimension than the other, and are closely spaced to the other strips in the set in parallel along their longer dimension.

8. The panel of claim 2, wherein the strips of each said set of film strips are rectangular, are substantially longer along one dimension than the other, and are closely spaced to the other strips in the set in parallel along their longer dimension.

9. The panel of claim 7, wherein each of the leads is affixed to, and in contact with, its respective strip at a head portion of said lead, the head portion being located substantially across the smaller dimension of the strip at one end along the longer dimension of the strip, the remaining portion of said lead extending from said head portion.

10. The panel of claim 8, wherein each of the leads is affixed to, and in contact with, its respective strip at a head portion of said lead, the head portion being located substantially across the smaller dimension of the strip at one end along the longer dimension of the strip, the remaining portion of said lead extending from said head portion.

* * * * *